(12) United States Patent  
Lammel et al.

(10) Patent No.: US 9,285,408 B2  
(45) Date of Patent: Mar. 15, 2016

(54) DETERMINATION OF POSITIONS

(75) Inventors: Gerhard Lammel, Tuebingen (DE); Jonas Eickmann, Aachen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 274 days.

(21) Appl. No.: 13/996,894

(22) PCT Filed: Nov. 4, 2011

(86) PCT No.: PCT/EP2011/069401  
§ 371 (c)(1),  
(2), (4) Date: Aug. 15, 2013

(87) PCT Pub. No.: WO2012/084322  
PCT Pub. Date: Jun. 28, 2012

(65) Prior Publication Data  
US 2013/0314104 A1    Nov. 28, 2013

(30) Foreign Application Priority Data

Dec. 21, 2010    (DE) .......................... 10 2010 063 702

(51) Int. Cl.  
*G01R 27/32*    (2006.01)  
*G01C 21/12*    (2006.01)  
(Continued)

(52) U.S. Cl.  
CPC ............... *G01R 27/32* (2013.01); *G01C 21/12* (2013.01); *G01C 21/206* (2013.01); *G01S 5/0257* (2013.01)

(58) Field of Classification Search  
USPC ............ 324/207.12, 207.13, 629; 455/456.1, 455/456.2, 456.3, 414.2, 456.6, 556.1; 701/472, 408, 468, 445, 469, 470, 500, 701/430, 522; 342/357.31, 357.2, 357.25, 342/357.28, 358, 383; 702/94, 150  
See application file for complete search history.

(56) References Cited

U.S. PATENT DOCUMENTS 5,311,195 A    5/1994    Mathis et al.  
6,502,033 B1   12/2002    Phuyal  
(Continued)

FOREIGN PATENT DOCUMENTS

EP    0 687 892    12/1995  
JP    4-364491     12/1992  
(Continued)

OTHER PUBLICATIONS

International Search Report, PCT International Application No. PCT/EP2011/069401, dated Feb. 17, 2012.

(Continued)

*Primary Examiner* — Melissa Koval  
*Assistant Examiner* — Nasima Monsur  
(74) *Attorney, Agent, or Firm* — Kenyon & Kenyon LLP

(57) ABSTRACT

A method for position determination, having a first step, in which a first sequence of positions is determined from radio signals of stationary transmitters, and a second sequence of positions being determined from other sensor data by dead reckoning. The first sequence of positions and the second sequence of positions are compared with one another in a second step. A computer program product for carrying out the method is also provided. A position determining device, in particular in a mobile terminal is also provided, having a receiver for radio signals of stationary transmitters, having position determining means for determining a first position of the receiver from radio signals of stationary transmitters, sensors at least for determining a direction and a distance in order to determine a second position by dead reckoning, and a memory for storing a sequence of first positions and a sequence of second positions. The first position determining device has a processing unit for comparing the sequence of first positions and the sequence of second positions.

19 Claims, 3 Drawing Sheets

(51) Int. Cl.
*G01C 21/20* (2006.01)
*G01S 5/02* (2010.01)

(56) References Cited

U.S. PATENT DOCUMENTS

| | | | |
|---|---|---|---|
| 6,871,061 B1 * | 3/2005 | Koorapaty et al. | 455/404.2 |
| 7,403,762 B2 | 7/2008 | Morgan et al. | |
| 7,474,897 B2 | 1/2009 | Morgan et al. | |
| 7,493,127 B2 | 2/2009 | Morgan et al. | |
| 2004/0012524 A1 * | 1/2004 | Couronne et al. | 342/387 |
| 2007/0010940 A1 * | 1/2007 | Tan et al. | 701/207 |
| 2009/0085806 A1 | 4/2009 | Piersol et al. | |

FOREIGN PATENT DOCUMENTS

| | | |
|---|---|---|
| JP | H 04 364 491 | 12/1992 |
| JP | 7-504971 | 6/1995 |
| JP | 8-5390 | 1/1996 |
| JP | 2008-519495 | 6/2008 |
| JP | 2009-501344 | 1/2009 |
| JP | 2009-89395 | 4/2009 |
| WO | WO 93/05587 | 3/1993 |

OTHER PUBLICATIONS

Evennou, F. et al., "Advanced Integration of WiFi and Inertial Navigation Systems for Indoor Mobile Positioning," *EURASIP Journal on Applied Signal Processing*, 2006.

Seitz, J. et al., "Sensor Data Fusion for Pedestrian Navigation using WLAN and INS," *Proceedings of Gyro Technology Symposium 2007*.

Wang, H. et al., "WLAN-based Pedestrian Tracking Using Particle Filters and Low-Cost MEMS Sensors," *Proceedings of Workshop on Positioning*, pp. 1-7, 2007.

* cited by examiner

DETERMINATION OF POSITIONS

FIELD

The present invention relates to a method for determining positions, having a first step, in which a first sequence of positions is determined from radio signals of generally stationary transmitters, and a second sequence of positions being determined from other sensor data by dead reckoning. The present invention also relates to a computer program product for carrying out the method. The present invention also relates to a position determining device.

BACKGROUND INFORMATION

Mainly WLAN positioning systems have previously been used commercially, which, on the basis of transmissions from identifiable transmitters (e.g., WLAN routers) as well as the measured reception strength of these transmissions at a receiver, for example, in a positioning device, determine its position. There are in principle two different approaches for this purpose, which are referred to as "position fingerprinting" and as "signal path modeling."

During "position fingerprinting," the entire range in which the system is to be used is surveyed prior to using the positioning system, and the reception strengths of all available WLAN networks are entered for each position on a grid. During operation of the positioning system, the reception strengths measured at the positioning device are compared with the reception strengths stored in the database, and the position is calculated on the basis of special algorithms. The simplest possible algorithm defines the position as being that position from the database whose measured reception strengths have the smallest geometric distance from the reception strengths measured during positioning.

During "signal path modeling," a database having the positions of all WLAN base stations in the positioning area is presupposed, which, among other things, is determinable by measuring the reception strengths in the positioning range as described in U.S. Pat. No. 7,403,762. During positioning, the reception strengths measured at the terminal are converted by a mathematical correlation into distances from the corresponding base station, and the instantaneous position is determined by trilateration based on the known router positions. Trilateration here differs from the conventional triangulation in that it uses only distance information but no angle information.

The accuracy of these two methods depends on the quality of the underlying database because the positioning will never be more accurate than the reference supplied by the database. The errors which may occur in compiling the database are manifold since the measured reception strength depends not only on the distance but, among other things, also on objects in the transmission path, the orientation of the terminal and the time. Furthermore, there is the possibility that, even after the database has been compiled, the positions of the routers may be altered, routers may be removed or new ones added. In order to ensure the functionality of the positioning system even in these cases, the quality of the positioning information of each router is evaluated, for example, as described in U.S. Pat. No. 7,474,897, and thus a decision is made as to whether it may be used for positioning.

U.S. Pat. No. 7,493,127 describes a method for updating the database during operation, in which the consistency of the reception information is tested during each positioning operation, and router positions are adjusted on the basis of the position of the terminal, as determined by other routers, or new router positions may be added in the case of inconsistent or new reception information. These methods ensure that the functionality of the system is not restricted due to changes in the properties of individual routers if other routers, with the aid of which the position may be determined, are present in sufficient numbers.

One possibility for improving the positioning accuracy for pedestrians is dead reckoning by ascertaining the direction and distance from a starting point, also referred to as an inertial navigation system (INS). An INS may be configured on the basis of MEMS sensors, for example. An acceleration sensor is used here to detect a change in position by counting steps in combination with the determination of the step length. In addition, an electronic compass is used, often in combination with a yaw rate sensor, to determine the direction of the horizontal locomotion, while a pressure sensor detects movements in the vertical axis. An improved positioning accuracy through sensor data fusion of INS data and WLAN data is described in "Advanced Integration of WiFi and Inertial Navigation Systems for Indoor Mobile Positioning" (F. Evennou, F. Marx, Eurasip Journal on Applied Signal Processing, Hindawi Publishing Corp., New York (2006)) and "WLAN-based Pedestrian Tracking Using Particle Filters and Low-Cost MEMS Sensors" (H. Wang, H. Lenz, A. Szabo, J. Bamberger, and U. Hanebeck, Proceedings of Workshop on Positioning, Navigation and Communication, 2007, pp. 1-7, 2007). INS data are used here to determine the position determined via WLAN as a function of time, e.g., with the aid of a particle filter, more accurately than would have been possible without INS.

Furthermore, an INS may be used to simplify the creation of a "location fingerprinting" database as described in "Sensor Data Fusion for Pedestrian Navigation using WLAN and INS" (J. Seitz, L. Patiño-Studencka, B. Schindler, S. Haimerl, J. G. Boronat, S. Meyer and J. Thielecke, in Proceedings of Gyro Technology Symposium 2007, September 2007). For this purpose, the path between two manually input reference positions is interpolated with the aid of the data obtained from INS during the creation of the database, so that fewer manual inputs are needed.

As described in the related art, the accuracy of a positioning system is limited due to the quality of the underlying database with reference positions, which may include the router positions, for example, in the case of WLAN positioning systems. The conventional methods of optimizing the database use only information obtained from the positioning system itself to detect changes in the position references. Thus, for example, the instantaneous position must be determined with the aid of the reception strength of multiple routers at multiple locations in order to be able to determine the position of a new router. Since the position measurement here is subject to a measuring error, the uncertainty in the position of the newly determined router is greater than that of the router used as the reference. Furthermore, systematic errors in the position determination, such as those which may be caused by the reception properties, due to the orientation of the terminal, are propagated directly onto the position of the new router. The quality of the position database therefore declines over time since with each change in router position, the uncertainty with respect to its position becomes greater.

Moreover, new routers may be assigned to a position only in the vicinity of multiple other routers since otherwise it is impossible to determine a reference position. The methods for database optimization may therefore be carried out only in areas having a high router density, but these methods fail on the outskirts of a city and in rural areas, for example.

SUMMARY

The present invention relates to a method for position determination, having a first step, in which a first sequence of positions is determined from radio signals from generally stationary transmitters, a second sequence of positions being determined from other sensor data by dead reckoning. In accordance with the present invention, the first sequence of positions and the second sequence of positions are compared with one another in a second step.

An example method according to the present invention permits an automated improvement in the database for the positioning without renewed measuring with the aid of a reference system. A step-by-step expansion of the position database at the edge of the area of use is possible. Mapping of the walkways in buildings is also possible. All of this results in an improved positioning accuracy as a benefit for the user of the positioning system and in lower operating costs for the operator of the positioning system since the quality of the database may be improved during operation by the positioning devices of the users without any additional effort.

The example method according to the present invention may advantageously be implemented in a computer program product according to the present invention or may also be carried out using a position determining device according to the present invention.

DETAILED DESCRIPTION OF EXAMPLE EMBODIMENTS

Previous systems have used INS and WLAN data to improve the accuracy of positioning at the lowest level. One object of the present invention is to have the systems initially determine a distance traveled in isolation and subsequently detect errors in the position determination of the positioning system based on radio transmitters by comparing the paths determined. Systematic errors in the database of the positioning system in particular are detectable in this way and new position references may also be added in peripheral areas and areas having only a few references. One idea on which the present invention is based is the general optimization of position databases by the position determining devices of the users based on dead reckoning. For example, MEMS sensors may be used in the position determining devices for this purpose. One possible implementation is presented below as an example.

Figure 1:
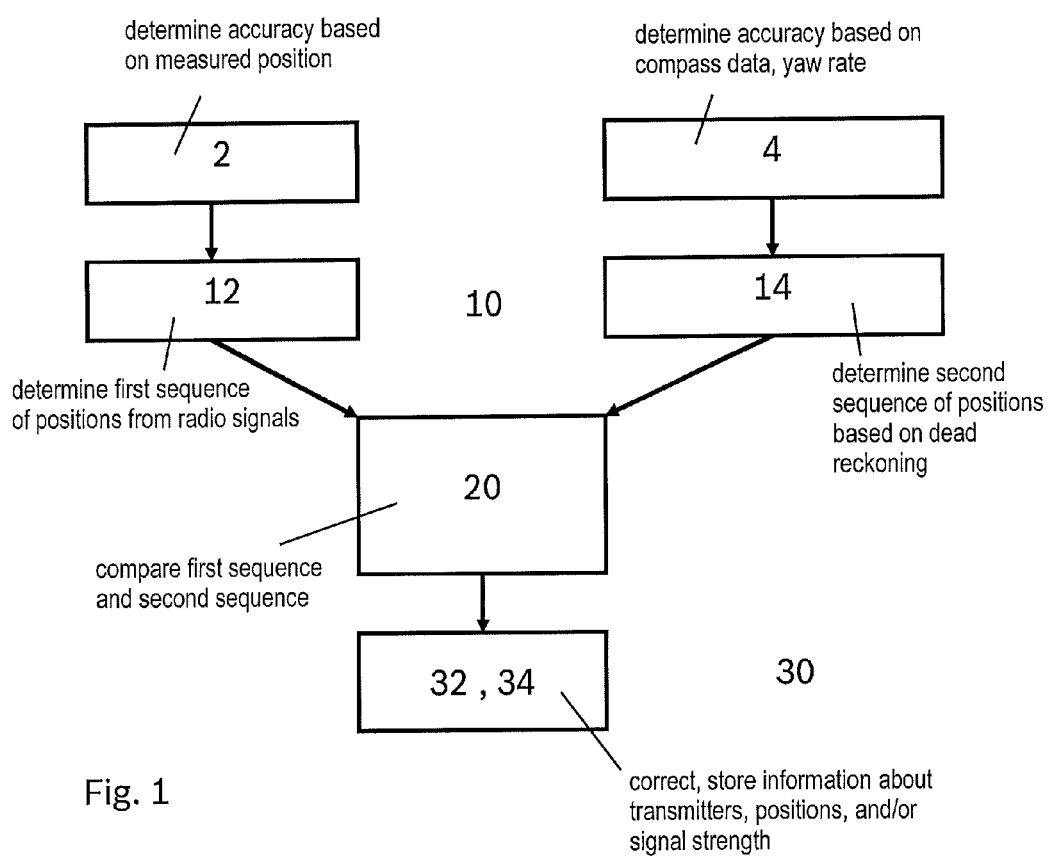
FIG. 1 shows an example of a method according to the present invention for position determination.
Figure 2:
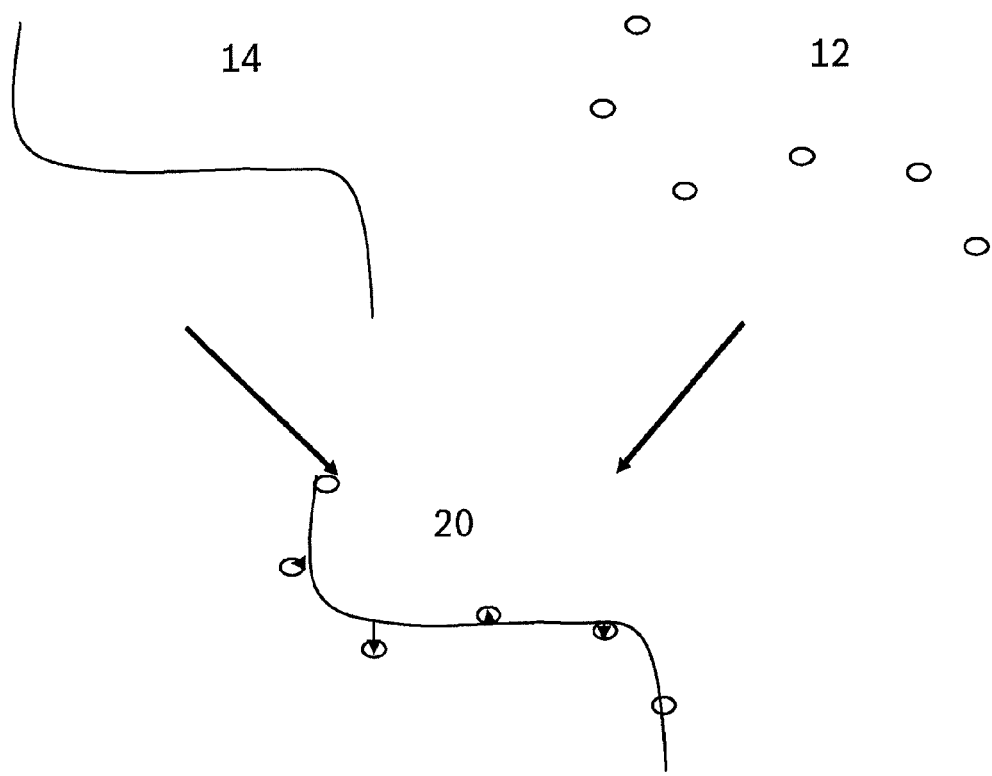
FIG. 2 shows the comparison of a first sequence of positions and a second sequence of positions according to the present invention.

FIG. 1 shows an example of a method according to the present invention for position determination. At the beginning of any data fusion, there is a determination of the accuracy of the individual systems. In the case of the positioning system based on radio transmitters, the determination of accuracy 2 is usually stated individually for each measured position; for the INS a determination of accuracy 4 may be ascertained by comparing compass data and yaw rate sensor data or properties of the compass offset compensation and the accuracy of the step length determination, followed by recording of the data during the actual positioning operation. FIG. 2 shows data recorded as an example.

FIG. 2 shows the comparison of a first sequence of positions and a second sequence of positions according to the present invention. In addition, this example shows a comparison of the two sequences of positions to ascertain a resulting sequence of positions. In a first step 10, a first sequence of positions 12 is determined from measurements of stationary radio transmitters and with the aid of the database of the positioning system. With the aid of dead reckoning in an INS, a second sequence of positions 14, i.e., a path, is determined in same step 10. In a second step 20, the two sequences of positions 12 and 14 are compared with one another. In addition, the two sequences of positions 12 and 14 are compared with one another in this example, and a resulting sequence of positions is ascertained. The comparison, or the data fusion, takes place, for example, with the aid of the method of least squares (English: least square estimation, LSE). It should be noted here that the translatory degrees of freedom must be taken into account only if a compass is used as a sensor of the INS. A rotation is not necessary in this case due to of the measurement of absolute values with the aid of the compass of the INS. Under the assumption, which is usually correct, that the path determined by the INS is more accurate than the positions determined by the positioning system based on radio transmitters, it is thus possible to determine the errors of the positioning system (shown as arrows in FIG. 2) following the comparison. By differentiation of the determined position of the positioning system according to the position of the individual routers, the error in the positioning system may be converted into an error in the database, which may be corrected by weighting it with the accuracy of the INS. The great advantage of this method is that errors in the positioning system and errors in the INS may be assumed uncorrelatedly, so that optimization of the database is still possible even if no information or only erroneous information about the position determination with the aid of the positioning system may be used. This makes it possible to enlarge the database at the outskirts of the area for which position references are available. Another great advantage of this method is that it may be assumed that different people will perform the positioning operation using different terminals (i.e., position determining devices). Since the errors in the INS of the various terminals are uncorrelated, these errors cancel one another out in multiple passes using different terminals. In fact, the database may be improved using this method since an error-free relationship on the average is established among all reference objects used for the position determination. The only error that cannot be corrected using this method is a shift in the positions of all reference objects of the positioning system without being free of averages. However, this case has practically no relevance.

This yields a number of advantages in comparison with the related art. The method according to the present invention permits an automated improvement in the database for the positioning (position database) without renewed measuring with the aid of a reference system. A step-by-step expansion of the position database at the outskirts of the area of use is possible. Mapping of walkways in buildings is also possible. All of this results in an improved positioning accuracy as a benefit for the user of the positioning system and results in lower operating costs for the operator of the positioning system because the quality of the database may be improved during operation by the positioning devices of the users without any additional effort.

The method for position determination according to the present invention relates to the main components of the positioning system based on radio transmitters, INS for recording a path of motion (dead reckoning), an algorithm for fusion of absolute positions and path information and methods for optimizing the database using the fused data. These components are described in greater detail below.

Positioning System Based on Radio Transmitters

The positioning system must be based on a database, which is used for mapping the information ascertained at the terminal onto the instantaneous position. This relates in particular to positioning systems based on radio networks, which are usually WLAN networks at the present time. In principle, however, the systems may also be based on Bluetooth or any other type of radio network. In principle, non-electromagnetic transmission methods (e.g., acoustic) are also conceivable. In the field of WLAN positioning methods, the method may be applied in particular to systems which are based on databases with router positions or which use the "position fingerprinting" method.

Recording the Path of Motion

A path of motion may be recorded as described on the basis of micromechanical sensors (MEMS), for example. MEMS are suitable for mobile positioning devices due to of their small size, robustness and low energy demand. In recording a path of motion, at least one sensor is needed for determining the amount of the change in position and at least one sensor is needed for determining the direction of the change in position. These may be in particular acceleration sensors, a compass and a yaw rate sensor. In principle, however, it is also possible to record path information based on other sensor data, e.g., the velocity and steering angle of a vehicle may be used and the vehicle may be an automobile or a bicycle in particular. It is also conceivable to combine a compass and a wheel speed measurement for use on bicycles.

Fusion of Position Information and Path Information

Both position information and path information may be represented mathematically as a set of tuples $\vec{X}_i$ including at least two coordinates, but a third coordinate and a time stamp may also be included.

$$\vec{X}_i = (x_i, y_i, z_i, t_1) \; i = 1 \ldots N$$

The number of tuples of position and path information may vary. It is assumed that there are N position tuples and M path tuples. The index i is used for position tuples as above and the index j is used for path tuples. The fusion of path and position information then takes place by determination of an extreme value of a mapping $$g(\Delta) = \sum_{i,j} f(X_i, X_j, \Delta)$$

according to variable $\Delta$, which indicates the shift between position information and path information. Those cases of interest in particular are those in which $f(X_i, X_j, \Delta)$ yields a value not equal to zero only for an $X_i$ and $X_j$ recorded at a similar point in time. The simplest case for two-dimensional tuples and N=M with simultaneity at i=j is $$f(X_i, X_j, \Delta) = \begin{cases} 0 \\ \sqrt{(\Delta_x + x_i - x_j)^2 + (\Delta_y + y_i - y_j)^2} \end{cases}$$

for $i \neq j$ otherwise $\Delta_x$ here denotes the shift between the coordinate systems of path information and position information in the x direction; $\Delta_y$ is defined similarly for the y direction. If a minimum of $g(\Delta)$ is determined with this definition, the geometric distance between the position information and the path information may be minimized through the choice of the $\Delta$ determined.

Implementation in multiple dimensions and using different distance definitions is also possible. The deviations in particular may be weighted differently here, depending on the direction, so that a deviation in the y direction, for example, is weighted more heavily than a deviation in the z direction since the position determination in the z direction may be less accurate. Similarly the time difference between the measuring points of the two measuring systems may also be handled like the values of the geometric directions.

The result of the fusion step is a deviation between the two measuring systems in all dimensions of the tuples for each measured point. If a system may be considered as error-free in good approximation, error $E_i$ thus determined is the measuring error of the other system at point i in question.

Optimization of the Database

To optimize a database based on the errors $E_i$ determined, there is the initial determination of which change in the database has which influence on the measured position for each position or each position having an $E_i$ above a threshold value. Mathematically this corresponds to a differentiation of the positions in database $P_i$ after a change in the measured position. Consequently, a correction of the database may be carried out on the basis of this value:

$$P_{i,new} = P_{i,alt} + k * \frac{\partial P_i}{\partial X_i} * E_i$$

$$(P_{i,new} = P_{i,old})$$

where k is a factor with which the change in the database is weighted. This factor depends on the accuracy of the measuring systems, for example, and the desired rate of optimization of the database.

If there are no entries in the position database for a position, but a position has been determined on the basis of previously determined positions and the measured path, then this position may be used to ascertain the position of as yet unknown position references (often WLAN routers), as described in the related art.

In summary, the method according to the present invention for position determination includes the main features of a first step 10, in which a first sequence of positions 12 is determined from radio signals from essentially stationary transmitters, and a second sequence of positions 14 is determined from other sensor data by dead reckoning, and the features of a second step 20 according to the present invention are determined, in which the first sequence of positions 12 and the second sequence of positions 14 are compared with one another.

In one embodiment of the method according to the present invention, the first sequence of positions 12 and the second sequence of positions 14 are compared, and a resulting sequence of positions is ascertained from this comparison.

In one exemplary embodiment of the method according to the present invention, which uses the positioning method of "position fingerprinting," the first sequence of positions 12 is determined from stored information about transmitters assigned to possible locations, for example, from a position database. In another exemplary embodiment of the method according to the present invention, which uses the positioning method of "signal path modeling," the first sequence of positions 12 is determined from stored positions and/or signal strengths of transmitters from a position database, for example.

In one embodiment of the method according to the present invention, at least one position 32 from the first sequence of positions 12 is corrected in a third step 30 following second step 20. The position database may be improved in this way. In one embodiment of the method according to the present invention, information about assigned transmitters or positions and/or signal strengths of at least one transmitter may be stored at least for one position 34 from the first sequence of positions 12 in a third step 30 following second step 20. The position database may be supplemented by a new entry and thus expanded in this way. The method according to the present invention may also be carried out several times in succession. Thus after second step 20 or after third step 30, for example, first step 10 may be carried out again. The first sequence of positions 12 and thus also the second sequence of positions 14 may be supplemented in first step 10 in particular by adding new positions to one new position, which is then sent for comparison or data fusion in second step 20. In one exemplary embodiment of the method, accuracy 2 of the individual position determination is determined prior to first step 10 for the positions of first sequence 12 and also accuracy 4 is determined for the positions of second sequence 14.

In addition to the method according to the present invention for position determination as described above, a computer program product for carrying out this method is also the object of the present invention.

Figure 3:
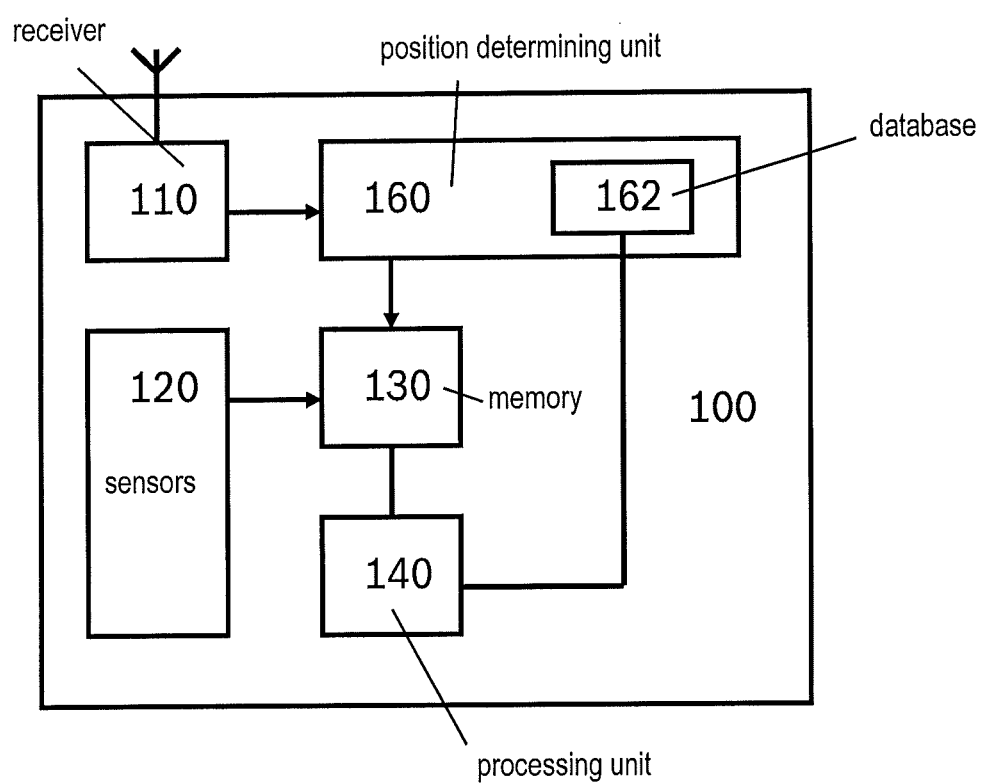
FIG. 3 shows an example of the position determining device according to the present invention.

In addition, a position determining device is also the object of the present invention. FIG. 3 shows an example of the position determining device according to the present invention. A position determining device 100 is shown, which may be situated in a mobile terminal, for example. Position determining device 100 includes a receiver 110 for radio signals of stationary transmitters, position determining means 160 for determining a first position of the receiver from radio signals of stationary transmitters and sensors 120 for determining a second position by dead reckoning. Sensors 120 therefore include at least one sensor for ascertaining a direction, for example, an electronic compass, a yaw rate sensor or a rotational acceleration sensor and at least one sensor for ascertaining a distance, such as, for example, a step counter, an odometer, a speedometer or an acceleration sensor. A pressure sensor may also be present to ascertain a vertical distance component, for example. These sensors may be embodied as MEMS, for example. MEMS are advantageously compact in design, robust and energy saving during operation. Position determining device 100 also includes a memory 130 for storing a sequence of first positions and a sequence of second positions. According to the present invention, the position determining device has a processing unit 140 for comparing the sequence of first positions and the sequence of second positions.

In one exemplary embodiment, the processing unit is configured in such a way that, for example, the comparison or the data fusion of the two sequences of positions is to be carried out in second step 20 according to the above exemplary embodiment of the method according to the present invention, and in particular a resulting sequence of positions is to be ascertained. In one exemplary embodiment, position determining element 160 includes a database 162 for storing information about transmitters assigned to possible locations, i.e., a database having information for the positioning method of "position fingerprinting," in which the reception strengths of all available radio transmitters, for example, WLAN networks, are recorded in a grid of possible positions of the position determining device. In one exemplary embodiment, position determining unit 160 include a database 162 for storing positions and/or signal strengths of transmitters for the positioning method of "signal path modeling."

What is claimed is:

1. A method for position determination, comprising:
   obtaining, by processing circuitry and via a receiver, electronic radio signals from stationary transmitters;
   obtaining, by the processing circuitry and via an input interface, sensor data from at least one sensor;
   determining, by the processing circuitry, a first sequence of positions by processing the electronic radio signals from the stationary transmitters;
   determining, by the processing circuitry, a second sequence of positions by dead reckoning processing of the sensor data;
   comparing, by the processing circuitry, the determined first sequence of positions to the determined second sequence of positions;
   ascertaining position information, by the processing circuitry and based on the comparison, wherein the position information is a resulting sequence of positions that represents a deviation of the first and second sequences of positions from each other; and
   optimizing the first sequence of positions by:
   differentiating the determined first sequence of positions; and
   weighting the differentiated determined positions based on the resulting sequence of positions to correct the deviation.

2. The method for position determination as recited in claim 1, wherein the first sequence of positions is determined from stored information about transmitters assigned to possible locations.

3. The method for position determination as recited in claim 1, wherein the first sequence of positions is determined based on at least one of stored positions and signal strengths of transmitters.

4. The method for position determination as recited in claim 3, further comprising storing for at least one position of the first sequence of positions information about at least one of the stationary transmitters, the determined positions, and signal strength of at least one transmitter.

5. The method for position determination as recited in claim 1, wherein the method is carried out several times in succession.

6. The method for position determination as recited in claim 1, wherein at least one of the first and second sequences of positions is supplemented by adding new positions to a new at least one of first and second sequences of positions.

7. The method for position determination as recited in claim 1, further comprising determining an accuracy of individual determined ones of the positions of at least one of the first sequence and the second sequence prior to the determining of the at least one of the first sequence and the second sequence.

8. A non-transitory computer readable storage medium storing a computer program for position determination, the computer program, when executed by a processor, causing the processor to perform a method, the method comprising:
   obtaining, via a receiver, electronic radio signals from stationary transmitters;
   obtaining, via an input interface, sensor data from at least one sensor;
   determining a first sequence of positions by processing the electronic radio signals from the stationary transmitters, and a second sequence of positions by dead reckoning processing of the sensor data;

comparing the determined first sequence of positions to the determined second sequence of positions;

based on the comparison, ascertaining position information, wherein the position information is a resulting sequence of positions that represents a deviation of the first and second sequences of positions from each other; and optimizing the first sequence of positions by:

differentiating the determined first sequence of positions; and weighting the differentiated determined positions based on the resulting sequence of positions to correct the deviation.

9. A position determining device in a mobile terminal, comprising:

a receiver for radio signals of stationary transmitters;

a position determining element to determine a sequence of first positions of the receiver from radio signals of stationary transmitters;

sensors at least to ascertain a direction and a distance for determination of a sequence of second positions by dead reckoning;

a memory to store the sequences of first positions and second positions; and a processing unit to:

compare the determined sequence of first positions to the determined sequence of second positions;

ascertain position information from the comparison, wherein the position information is a resulting sequence of positions that represents a deviation of the sequence of first positions and the sequence of second positions from each other; and optimize the sequence of first positions by:

differentiating the determined sequence of first positions; and weighting the differentiated determined positions based on the resulting sequence of positions to correct the deviation.

10. The position determining device as recited in claim 9, further comprising:

a database to store information about transmitters assigned to possible locations.

11. The position determining device as recited in claim 9, further comprising:

a database to store at least one of positions and signal strengths of transmitters.

12. The position determining device as recited in claim 9, wherein the sensors include at least one of: a yaw rate sensor, an electronic compass, an acceleration sensor, a step counter, and a pressure sensor.

13. The method for position determination as recited in claim 1, wherein the comparison is performed using a least squares estimate.

14. The method for position determination as recited in claim 1, wherein the first sequence of positions and the second sequence of positions each includes a plurality of indexed data, the data for each index having at least two coordinates and a timestamp.

15. The method for position determination as recited in claim 1, wherein the correction is only performed when the comparison indicates that the deviation is a non-zero value for data from corresponding index values.

16. The position determining device as recited in claim 9, wherein the sensors include at least a first sensor and a second sensor, wherein the first sensor determines the distance and the second sensor determines the direction of the distance.

17. The position determining device as recited in claim 9, further comprising a database in which positions of the stationary transmitters are stored, wherein the sequence of first positions is determined based on the stored positions.

18. The position determining device as recited in claim 9, further comprising a database in which signal strengths of the stationary transmitters are stored, wherein the sequence of first positions is determined based on the stored signal strengths.

19. The position determining device as recited in claim 9, further comprising a database in which positions and signal strengths of the stationary transmitters are stored, wherein the sequence of first positions is determined based on the stored positions and signal strengths.

* * * * *